US012347648B2

(12) United States Patent
Vasquez et al.

(10) Patent No.: US 12,347,648 B2
(45) Date of Patent: Jul. 1, 2025

(54) FILTER BOX FOR A SUBSTRATE PROCESSING SYSTEM

(71) Applicant: LAM RESEARCH CORPORATION, Fremont, CA (US)

(72) Inventors: Miguel Benjamin Vasquez, Portland, OR (US); David French, Fort Myers, FL (US)

(73) Assignee: Lam Research Corporation, Fremont, CA (US)

( * ) Notice: Subject to any disclaimer, the term of this patent is extended or adjusted under 35 U.S.C. 154(b) by 902 days.

(21) Appl. No.: 17/594,968

(22) PCT Filed: May 5, 2020

(86) PCT No.: PCT/US2020/031404
§ 371 (c)(1),
(2) Date: Nov. 4, 2021

(87) PCT Pub. No.: WO2020/227252
PCT Pub. Date: Nov. 12, 2020

(65) Prior Publication Data
US 2022/0319810 A1    Oct. 6, 2022

Related U.S. Application Data

(60) Provisional application No. 62/843,720, filed on May 6, 2019.

(51) Int. Cl.
*H01J 37/32* (2006.01)
*C23C 16/505* (2006.01)
(Continued)

(52) U.S. Cl.
CPC ...... *H01J 37/32174* (2013.01); *C23C 16/505* (2013.01); *H03H 1/0007* (2013.01);
(Continued)

(58) Field of Classification Search
None
See application file for complete search history.

(56) References Cited

U.S. PATENT DOCUMENTS 5,879,176 A * 3/1999 Stimson ............. H01R 13/7035
200/51.09
5,911,856 A * 6/1999 Suzuki ................ C23C 14/0042
204/192.27
(Continued)

FOREIGN PATENT DOCUMENTS

CN    106851956 A    6/2017
JP    2002330007 A    11/2002
(Continued)

OTHER PUBLICATIONS

Merriam-Webster dictionary definition of "filter" (Year: 2024).*
(Continued)

*Primary Examiner* — Ram N Kackar
*Assistant Examiner* — Laureen Chan (57) ABSTRACT

A filter module for a substrate processing chamber includes a plurality of exterior panels defining an interior, a plurality of internal panels defining a plurality of compartments within the interior of the filter module, and an adjustable capacitor arranged on a first panel of the plurality of internal panels within a first compartment of the plurality of compartments. The adjustable capacitor is coupled, through the first panel, to a motor located outside of the first compartment, and the adjustable capacitor is configured to receive a radio frequency input signal and provide a radio frequency voltage to the substrate processing chamber based on a position of the motor.

18 Claims, 8 Drawing Sheets

(51) Int. Cl.
  *H03H 1/00* (2006.01)
  *H03H 7/01* (2006.01)
(52) U.S. Cl.
  CPC ...... *H03H 7/0153* (2013.01); *H01J 37/32899* (2013.01); *H01J 2237/3321* (2013.01)

(56) References Cited

U.S. PATENT DOCUMENTS

| | | | |
|---|---|---|---|
| 7,112,926 | B2 | 9/2006 | Himori et al. |
| 9,312,832 | B2 | 4/2016 | Jafarian-Tehrani |
| 2002/0134508 | A1* | 9/2002 | Himori ............... H05H 1/46 |
| | | | 156/345.43 |
| 2002/0163398 | A1 | 11/2002 | Kondo et al. |
| 2004/0154540 | A1* | 8/2004 | Hayami ........... H01J 37/32082 |
| | | | 118/728 |
| 2008/0011424 | A1* | 1/2008 | Yin ................. H01J 37/32899 |
| | | | 156/345.48 |
| 2012/0032756 | A1* | 2/2012 | Long ..................... H03H 7/01 |
| | | | 333/181 |
| 2015/0091441 | A1 | 4/2015 | Marakhtanov et al. |
| 2015/0229288 | A1* | 8/2015 | Kisner ................ H03H 7/0115 |
| | | | 333/168 |
| 2016/0028362 | A1* | 1/2016 | Jafarian-Tehrani ...................... |
| | | | H03H 7/0138 |
| | | | 333/17.1 |
| 2016/0049280 | A1* | 2/2016 | Kudela ............. H01J 37/32137 |
| | | | 315/111.21 |
| 2016/0093445 | A1* | 3/2016 | Mildner ................ H01G 5/013 |
| | | | 361/279 |
| 2016/0276230 | A1* | 9/2016 | Nagorny ............. H01L 21/3065 |
| 2017/0125218 | A1* | 5/2017 | Sato .................. H01J 37/32917 |
| 2020/0043703 | A1 | 2/2020 | French et al. |

FOREIGN PATENT DOCUMENTS

| | | |
|---|---|---|
| JP | 2015097197 A | 5/2015 |
| KR | 1020020047229 A | 6/2002 |
| KR | 1020140137964 A | 12/2014 |
| KR | 1020160044428 A | 4/2016 |
| KR | 1020170059505 A | 5/2017 |

OTHER PUBLICATIONS

Office Action from corresponding Taiwanese Application No. 109114874, dated Mar. 5, 2024.
Notice of Reason of Refusal from corresponding Japanese Application No. 2021-565866, dated Mar. 19, 2024.
International Search Report and Written Opinion of the ISA issued in PCT/US2020/031404, mailed Sep. 4, 2020; ISA/KR.

* cited by examiner

FILTER BOX FOR A SUBSTRATE PROCESSING SYSTEM

CROSS-REFERENCE TO RELATED APPLICATIONS

This application is a U.S. National Phase Application under 35 U.S.C. 371 of International Application No. PCT/US2020/031404, filed on May 5, 2020, which claims the benefit of U.S. Provisional Application No. 62/843,720, filed on May 6, 2019. The entire disclosures of the applications referenced above are incorporated herein by reference.

FIELD

The present disclosure relates to a radio frequency (RF) box configured to filter RF interference from signals communicated in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems are used to perform treatments such as deposition and etching of film on substrates such as semiconductor wafers. For example, deposition may be performed to deposit conductive film, dielectric film, or other types of film using chemical vapor deposition (CVD), plasma enhanced CVD (PECVD), atomic layer deposition (ALD), plasma enhance ALD (PEALD), and/or other deposition processes. During deposition, the substrate is arranged on a substrate support and one or more precursor gases may be supplied to a processing chamber during one or more process steps. In a PECVD or PEALD process, plasma is used to activate chemical reactions within the processing chamber during deposition.

SUMMARY

A filter module for a substrate processing chamber includes a plurality of exterior panels defining an interior, a plurality of internal panels defining a plurality of compartments within the interior of the filter module, and an adjustable capacitor arranged on a first panel of the plurality of internal panels within a first compartment of the plurality of compartments. The adjustable capacitor is coupled, through the first panel, to a motor located outside of the first compartment, and the adjustable capacitor is configured to receive a radio frequency input signal and provide a radio frequency voltage to the substrate processing chamber based on a position of the motor.

In other features, the adjustable capacitor is configured to provide the radio frequency voltage to filter circuitry within the first compartment and the filter circuitry is configured to provide a filtered RF frequency voltage to the substrate processing chamber. The filter module further includes an insulative spacer provided between the adjustable capacitor and the first panel. The filter module further includes an encoder configured to map a capacitance of the adjustable capacitor to an absolute position of the motor.

In other features, a second panel of the plurality of the internal panels separates the first compartment from a second compartment of the plurality of compartments. A third panel of the plurality of the internal panels separates the second compartment from a third compartment of the plurality of compartments. At least one of the second compartment and the third compartment includes filter circuitry configured to filter a heater power signal and provide the filtered heater power signal to the substrate processing chamber.

In other features, the plurality of exterior panels includes a front panel, a back panel, a top panel, a bottom panel, and first and second side panels. The filter module is rectangular and includes a notched corner, and wherein the motor is arranged within the notched corner. The first side panel includes an input connector configured to receive a cable connector and the input connector is configured to receive the radio frequency input signal via the cable connector. A leaf spring is arranged on the first side panel between the input connector and the cable connector and the cable connector connects to the input connector through an opening in the leaf spring. A first end of the leaf spring is mounted on the first side panel and a second end of the leaf spring extends past a perimeter of the first side panel.

In other features, the second end of the leaf spring extends over a contact switch arranged on the back panel of the filter module. Connecting the cable connector to the input connector causes the second end of the leaf spring to engage the contact switch. The contact switch is configured to generate a signal indicating whether at least one of the filter module is installed on the substrate processing chamber and the cable connector is connected to the input connector. The first side panel includes a removable access panel and the first end of the leaf spring is mounted to the first side panel through the removable access panel.

In other features, a substrate processing tool includes a plurality of substrate processing chambers and a plurality of the filter modules. Each of the plurality of filter modules is mounted on a respective one of the plurality of processing chambers. Each of the filter modules includes a removable side panel, and wherein the removable side panel of each of the filter modules faces an outer perimeter of the substrate processing tool.

A filter module for a substrate processing chamber includes a plurality of exterior panels defining an interior, a plurality of internal panels defining a plurality of compartments within the interior of the filter module, and an adjustable capacitor arranged on a first panel of the plurality of internal panels within a first compartment of the plurality of compartments. The adjustable capacitor is coupled, through the first panel, to a motor located outside of the first compartment, and the adjustable capacitor is configured to receive a radio frequency input signal and provide a radio frequency voltage to the substrate processing chamber based on a position of the motor. The adjustable capacitor is configured to provide the radio frequency voltage to filter circuitry within the first compartment and the filter circuitry is configured to provide a filtered RF frequency voltage to the substrate processing chamber. Second and third compartments of the plurality of compartments each include respective circuitry.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

A substrate processing system may include one or more radio frequency (RF) filter modules (e.g., filter boxes) enclosing RF filter and/or tuning circuits configured to filter RF noise from electrical signals communicated to and from components within the substrate processing system. The filter box may be arranged on or adjacent to and/or integrated with a wall of a processing chamber. For example, the filter box may be arranged on a lower surface of the processing chamber. Service, installation, and/or adjustment of internal filter circuitry of the filter box may be difficult.

A filter box according to the principles of the present disclosure has an improved geometry and arrangement of external and internal features to facilitate installation and removal of the filter box to and from the processing chamber. Further, the filter box is configured to facilitate service and replacement of internal components (e.g., filter circuitry, such as filter printed circuit boards (PCBs), motors, capacitors, etc.) and adjustment of filtering parameters (e.g., using an adjustable capacitor).

Figure 1:
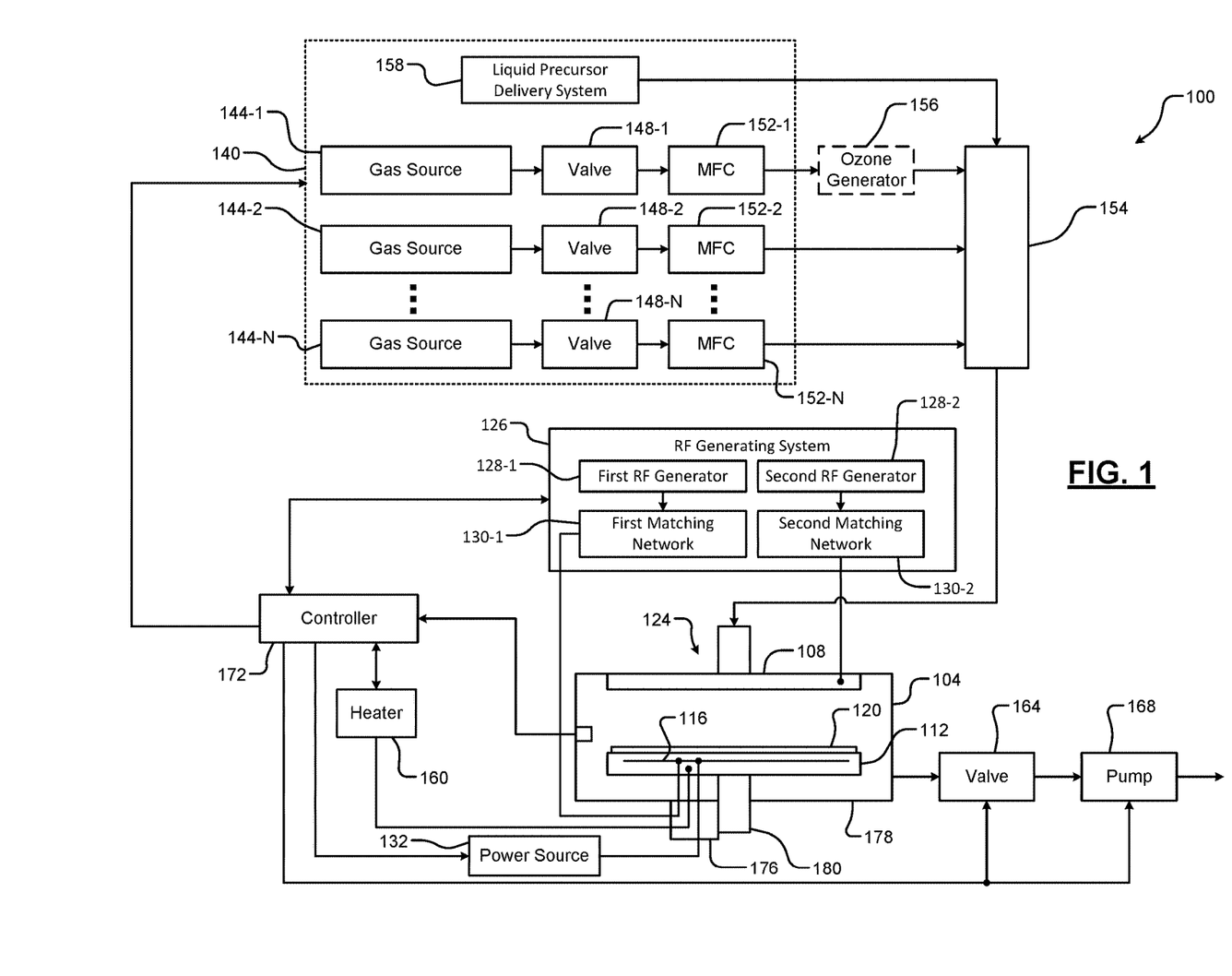
FIG. 1 is a functional block diagram of an example substrate processing system according to the present disclosure.

Referring now to FIG. 1, an example of a substrate processing system 100 according to the principles of the present disclosure is shown. While the foregoing example relates to PECVD systems, other plasma-based substrate processing chambers may be used. The substrate processing system 100 includes a processing chamber 104 that encloses other components of the substrate processing system 100. The substrate processing system 100 includes an upper electrode 108 and a substrate support such as a pedestal 112 including a lower electrode 116. Although shown as a single lower electrode 116, the lower electrode 116 may correspond to two or more electrodes arranged in different zones of the pedestal 112. A substrate 120 is arranged on the pedestal 112 between the upper electrode 108 and the lower electrode 116.

For example only, the upper electrode 108 may include a showerhead 124 that introduces and distributes process gases. Alternately, the upper electrode 108 may include a conducting plate and the process gases may be introduced in another manner. The lower electrode 116 may be arranged in a non-conductive pedestal. Alternately, the pedestal 112 may include an electrostatic chuck that includes a conductive plate that acts as the lower electrode 116.

A radio frequency (RF) generating system 126 generates and outputs an RF voltage to the upper electrode 108 and/or the lower electrode 116 when plasma is used. In some examples, one of the upper electrode 108 and the lower electrode 116 may be DC grounded, AC grounded, or at a floating potential. For example only, the RF generating system 126 may include one or more RF voltage generators 128 (e.g., a capacitively-coupled plasma RF power generator, a bias RF power generator, and/or other RF power generator) such as a first RF generator 128-1 and a second RF generator 128-2 that generate RF voltages, which are fed by one or more matching and distribution networks 130 to the lower electrode 116 (e.g., via a first matching network 130-1) and the upper electrode 108 (e.g., via a second matching network 130-2).

The first RF generator 128-1 provides an RF and/or bias voltage to the lower electrode 116. The lower electrode 116 (which, in some examples, may comprise multiple electrodes) may receive power alternatively or additionally from other power sources, such as a power source 132. The second RF generator 128-2 may provide an RF voltage or may simply connect the upper electrode 108 to a ground reference.

An example gas delivery system 140 includes one or more gas sources 144-1, 144-2, . . . , and 144-N (collectively gas sources 144), where N is an integer greater than zero. The gas sources 144 supply one or more gases (e.g., precursors, inert gases, etc.) and mixtures thereof. Vaporized precursor may also be used. At least one of the gas sources 144 may contain gases used in the pre-treatment process of the present disclosure (e.g., $NH_3$, $N_2$, etc.). The gas sources 144 are connected by valves 148-1, 148-2, . . . , and 148-N (collectively valves 148) and mass flow controllers 152-1, 152-2, . . . , and 152-N (collectively mass flow controllers 152) to a manifold 154. An output of the manifold 154 is fed to the processing chamber 104. For example only, the output of the manifold 154 is fed to the showerhead 124. In some examples, an optional ozone generator 156 may be provided between the mass flow controllers 152 and the manifold 154. In some examples, the substrate processing system 100 may include a liquid precursor delivery system 158. The liquid precursor delivery system 158 may be incorporated within the gas delivery system 140 as shown or may be external to the gas delivery system 140. The liquid precursor delivery system 158 is configured to provide precursors that are liquid and/or solid at room temperature via a bubbler, direct liquid injection, vapor draw, etc.

A heater 160 may be connected to a heater coil (not shown) arranged in the pedestal 112 to heat the pedestal 112. The heater 160 may be used to control a temperature of the pedestal 112 and the substrate 120. A valve 164 and pump 168 may be used to evacuate reactants from the processing chamber 104. A controller 172 may be used to control various components of the substrate processing system 100. For example only, the controller 172 may be used to control flow of process, carrier and precursor gases, striking and extinguishing plasma, removal of reactants, monitoring of chamber parameters, etc.

An RF filter module (e.g., an RF filter box) 176 is arranged adjacent to the processing chamber 104 to filter RF noise from electrical signals communicated to and from components within the processing chamber 104. For example, the RF filter module 176 is arranged below the processing chamber 104 on a bottom surface 178 of the processing chamber 104 adjacent to a portion (e.g., a stem) 180 of the pedestal 112 extending below the bottom surface 178. Although shown directly adjacent to the pedestal 112 for simplicity, other structures may be arranged between the pedestal 112 and the RF filter module 176. The RF filter module 176 encloses one or more tuning circuits, RF filter circuits, etc. (not shown in FIG. 1). The tuning circuits may be connected (i) between the first matching network 130-1 and a corresponding electrode, such as the electrode 116 and (ii) between the power source 132 and a corresponding electrode.

The tuning circuits control the RF voltages supplied to the electrode 116 and may include variable and/or fixed impedances that may be tuned for the substrate processing being performed. The RF voltages and corresponding current supplied to the electrode 116 may be controlled to change aspects of generated plasma. For example, in some capacitive coupled plasma (CCP) systems, RF voltage signals can be supplied to the lower electrode 116 to create and sustain plasma. Other electrical signals (e.g., power signals provided from a heater 160) may pass through the RF filter module 176. Example tuning and RF filter circuits that may be enclosed within the RF filter module 176 according to the principles of the present disclosure are described in more detail in U.S. patent application Ser. No. 16/052,877, filed on Aug. 2, 2018, the entire contents of which are hereby incorporated herein.

Figure 2A:
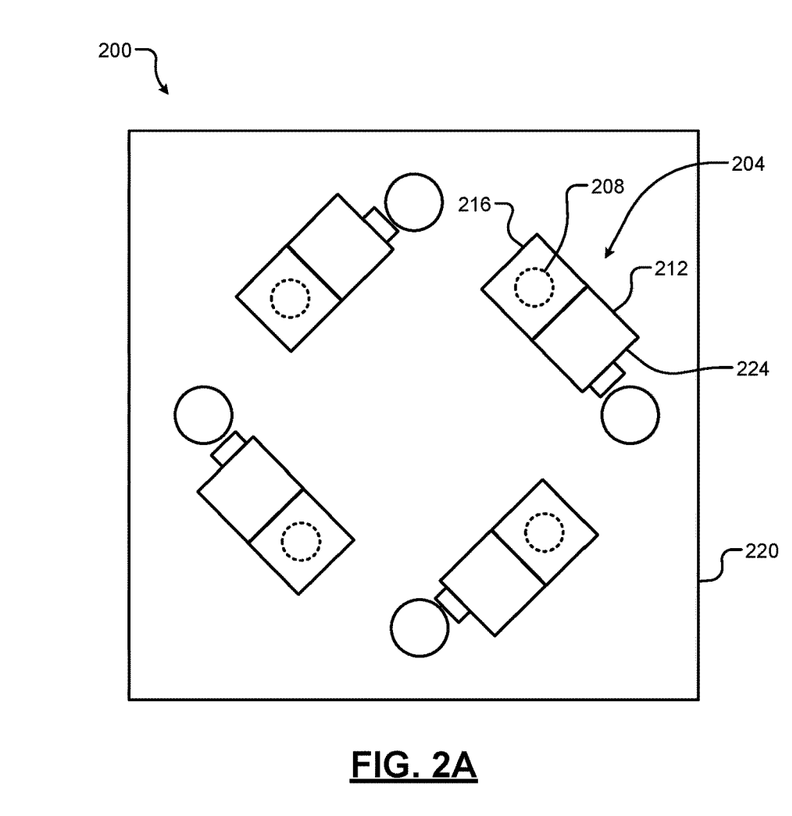
FIGS. 2A and 2B are bottom plan views of an example substrate processing tool of a substrate processing system including a radio frequency (RF) filter module according to the present disclosure.
Figure 2B:
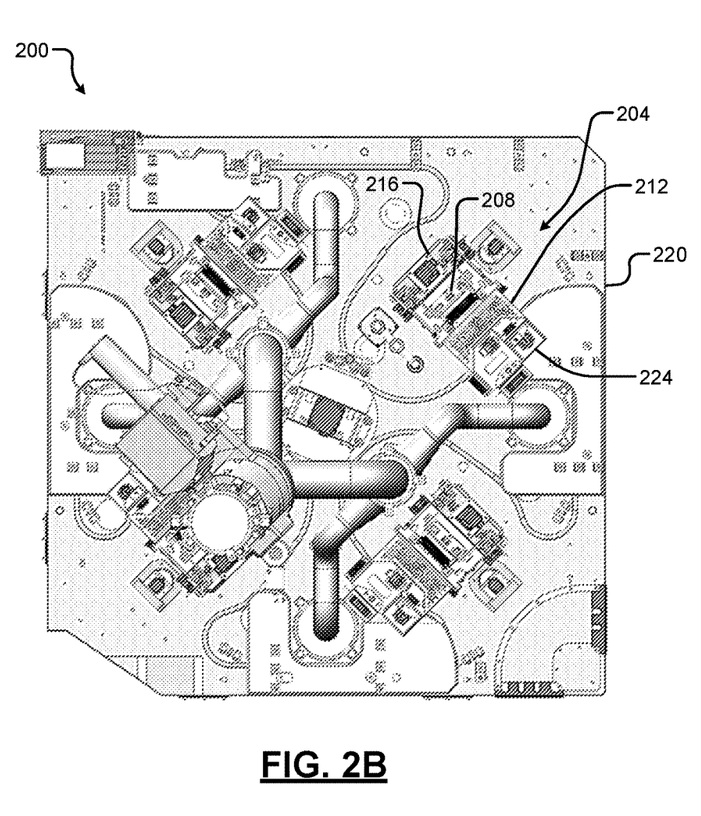

Referring now to FIGS. 2A and 2B, bottom plan views of an example substrate processing tool 200 of a substrate processing system are shown. The tool 200 may include one or more processing stations 204. As shown, the substrate processing tool 200 includes four of the stations 204 but in other examples fewer or more of the stations 204 may be included. Each of the stations 204 may be configured to perform the same or different processes performed in others of the stations 204.

Each of the stations 204 includes a corresponding pedestal 208 and a respective RF filter module 212 configured and arranged according to the principles of the present disclosure. As shown, a pedestal control module 216 is arranged adjacent to the pedestal 208. For example, the pedestal control module 216 includes actuators, circuitry, etc. configured to control raising and lowering and rotation of the pedestal 208. Each of the RF filter modules 212 is arranged to facilitate installation and servicing. For example, each of the RF filter modules 212 is in a same position relative to a respective one of the pedestals 208 and an outer perimeter 220 of the substrate processing tool 200. A panel (e.g., a removable side or front panel) 224 of the RF filter module 212 faces outward toward the outer perimeter 220 to facilitate servicing.

Figure 3A:
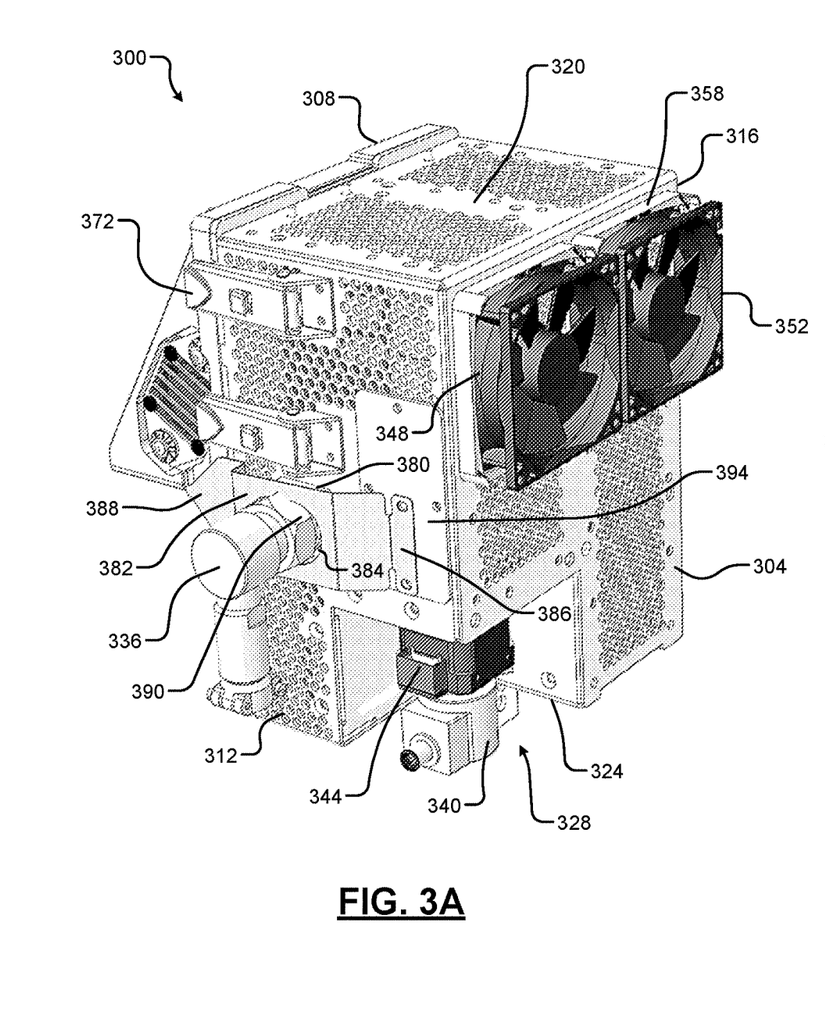
FIGS. 3A and 3B are views of an example RF filter module according to the present disclosure.
Figure 3B:
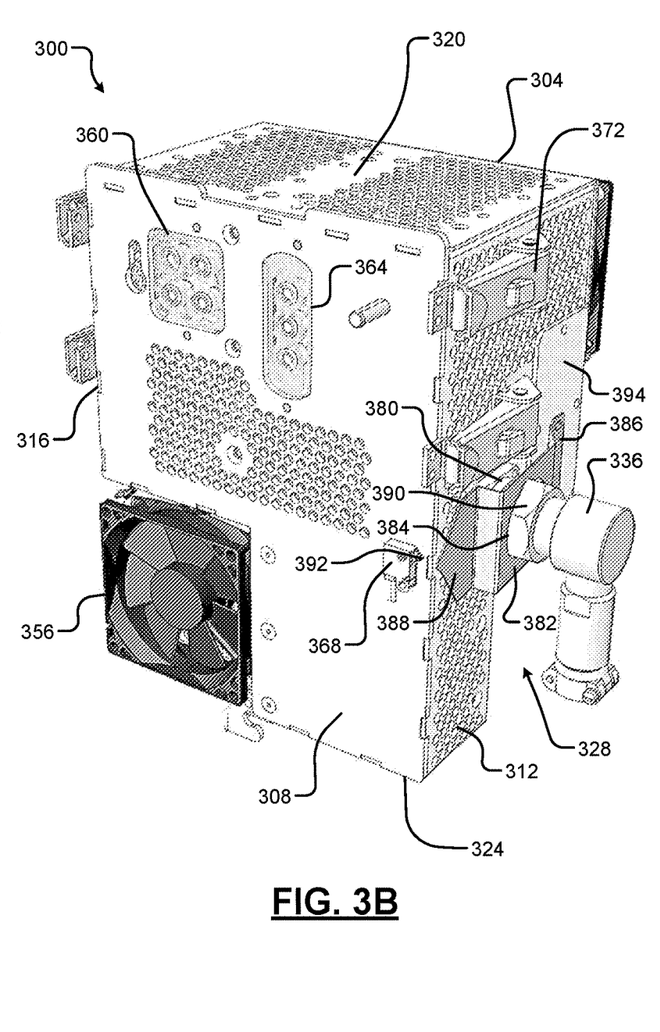
Figure 4A:
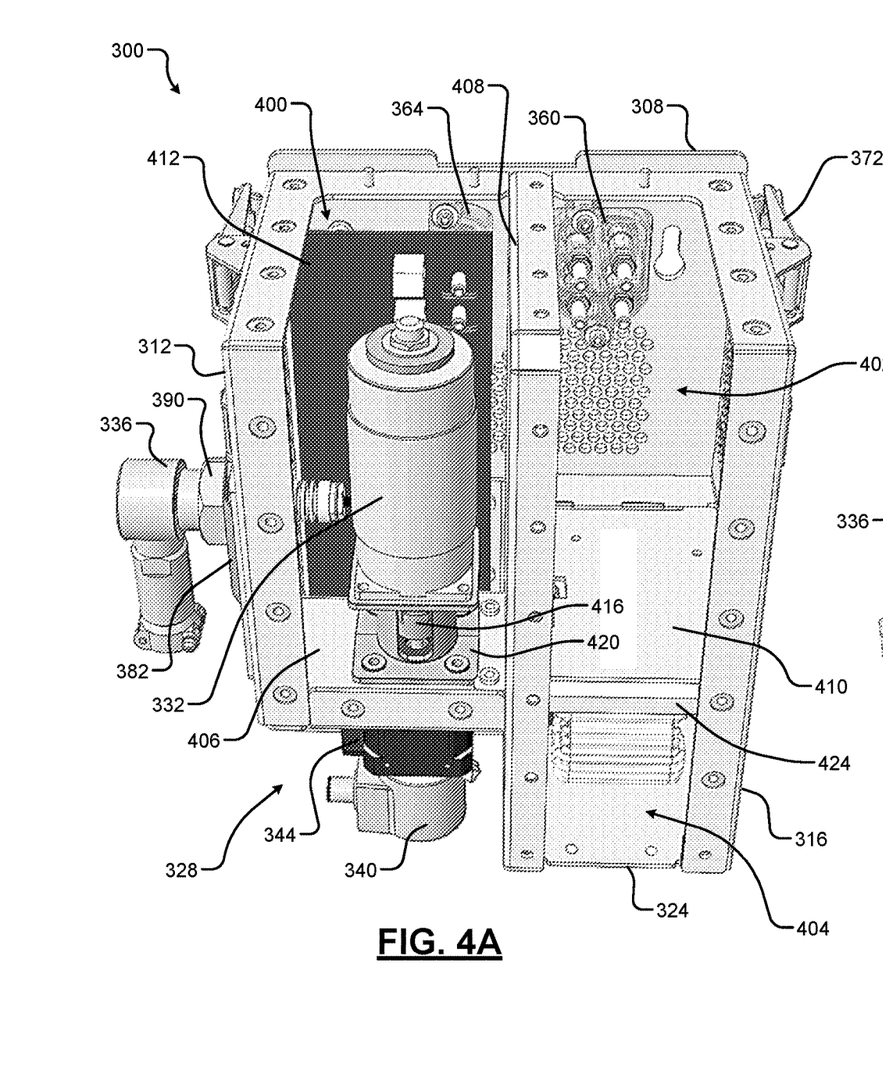
FIGS. 4A and 4B are example interior views of the RF filter module of FIGS. 3A and 3B according to the present disclosure.
Figure 4B:
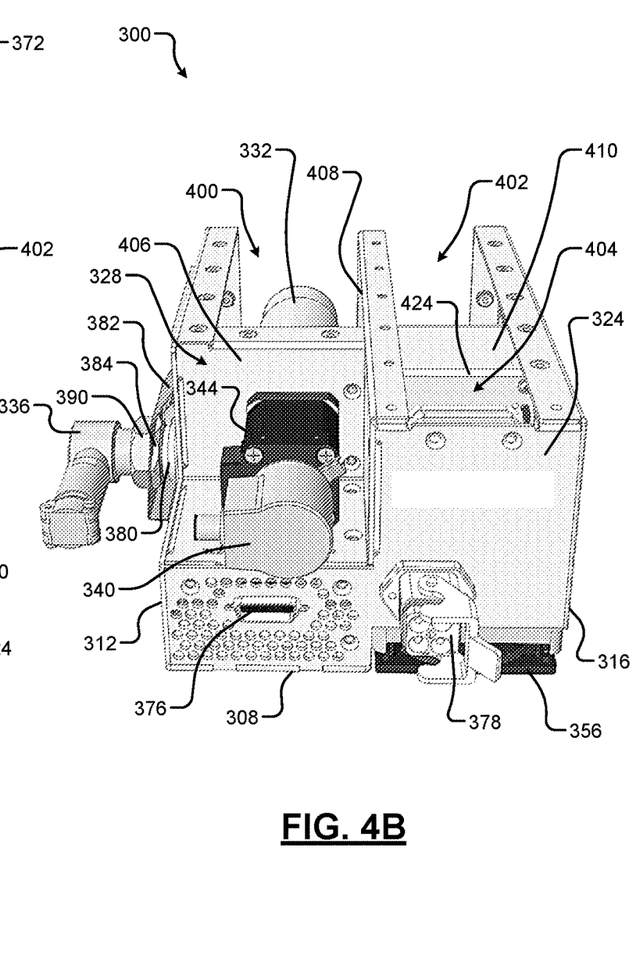

Referring now to FIGS. 3A, 3B, 4A, and 4B, views of an example RF filter module (i.e., a rectangular RF filter box) 300 are shown. The RF filter module 300 includes exterior panels including a front panel (e.g., a removable front panel) 304, a back panel 308, side panels 312 and 316, a top panel 320, and a bottom panel 324. In FIGS. 4A and 4B, the RF filter module 300 is shown with the front panel 304 and the top panel 320 removed.

While generally rectangular, the RF filter module 300 includes a notched or recessed corner 328. The RF filter module 300 includes at least one adjustable capacitor 332 for adjusting parameters of the RF filter module 300. For example, the adjustable capacitor 332 in FIGS. 4A and 4B receives an RF input signal (e.g., via a right angle RF cable connector 336) and magnitudes of RF voltages output by the RF filter module 300 vary in accordance with the adjusted capacitance of the capacitor 332.

In some examples, the capacitor 332 includes first and second cylinders that have a variable overlap. The capacitance of the adjustable capacitor 332 may be adjusted using an encoder 340 and motor 344 (e.g., responsive to a signal from the controller 172 indicating a commanded position of the motor 344). For example, the motor 344 varies the overlap of the first and second cylinders of the capacitor 332 to vary the capacitance. For example, the motor 344 corresponds to a stepper motor and the encoder 340 corresponds to an absolute encoder that maps the capacitance of the capacitor 332 to the commanded position of the motor 344. While the capacitor 332 is enclosed within the RF filter module 300, the encoder 340 and the motor 344 are located outside of the RF filter module 300 within the notched corner 328. Accordingly, access to the motor 344 (e.g., for replacement, servicing, etc.) is facilitated.

The RF filter module 300 includes a plurality of fans, including fans 348 and 352 arranged on an upper portion of the front panel 304 and a fan 356 arranged on a lower portion of the back panel 308. For example only, the fans 348, 352, and 356 correspond to 80 mm fans and are each mounted to the RF filter module 300 via a respective vibration pad 358. The back panel 308 may also include output contact interfaces 360 and 364 for connectors (not shown) for providing output signals to the heater 160 and the electrode 116, respectively (e.g., signals corresponding to heater power signals and RF output voltages). A contact switch 368 is arranged to provide signals (e.g., to the controller 172) indicating whether the RF filter module 300 is installed and secured and the connecter 336 is connected to the RF filter module 300 as described below in more detail. For example, the contact switch 368 is arranged on an adapter bracket (not shown in FIGS. 3A, 3B, 4A, and 4B; described below in more detail) attached to the RF filter module 300.

The side panels 312 and 316 include a plurality of latches 372 arranged to mount the RF filter module 300 to the substrate processing tool 200. The bottom panel 324 includes input contact interfaces 376 and 378 for connectors (not shown) for receiving input signals for DC power (e.g., to provide DC power to internal circuitry of the RF filter module 300) and heater power (e.g., to provide power to the heater 160).

In some examples, the side panel 312 corresponds to a side of the RF filter module 300 facing outward toward the outer perimeter 220 of the substrate processing tool 200 to facilitate servicing as described above in FIGS. 2A and 2B. The side panel 312 includes an RF input connector 380 configured to receive the RF cable connector 336. The RF input connector 380 receives the RF input signal from the RF cable connector 336 and provides the RF input signal to the adjustable capacitor 332 as described above.

A contact mechanism such as a flat spring (e.g., a leaf spring) 382 is arranged at an interface between the RF input connector 380 and the RF cable connector 336. For example, the RF cable connector 336 connects to the RF input connector 380 through an opening 384 in the leaf spring 382. A first end (e.g., corresponding to an end with a mounting bracket 386) of the leaf spring 382 is connected to the side panel 312 while a second end (e.g., corresponding to a contact portion 388) extends past a perimeter of the side panel 312 over the contact switch 368.

Connecting the RF cable connector 336 to the RF input connector 380 (e.g., by tightening the connection using nut 390) biases the leaf spring 382 toward the side panel 312 and the contact switch 368. For example, the contact switch 368 may include a button 392 or other contact mechanism. Accordingly, when the RF cable connector 336 is connected to the RF input connector 380, the contact portion 388 of the leaf spring 382 engages (e.g., contacts) the button 392 of the contact switch 368. The contact switch 368 is configured to generate signals indicating whether the contact portion 388 is in contact with the contact switch 368 (i.e., in accordance with a position of the leaf spring 382).

In this manner, the signals generated by the contact switch 368 indicate multiple statuses associated with the RF filter module 300. For example, the signals indicate whether the RF filter module 300 is installed on the substrate processing tool 200 and whether the RF cable connector 336 is connected to the RF input connector 380. In some examples, the side panel 312 may include a removable access panel 394 for providing access to internal circuitry of the RF filter module 300. The leaf spring 382 may be mounted to the side panel 312 via the access panel 394. For example, the mounting bracket 386 may be attached to the side panel 312 through the access panel 394. Accordingly, the signals generated by the contact switch 368 based on the position of the leaf spring 382 may further indicate whether the access panel 394 is attached to the side panel 312.

As shown in FIGS. 4A and 4B, the RF filter module 300 may define multiple compartments, such as compartments 400, 402, and 404, and internal panels (e.g., sheet metal panels) 406, 408, and 410. For example, the adjustable capacitor 332 is mounted on the panel 406. The panel 408 separates the compartment 400 from the compartment 402. The panel 410 separates the compartment 402 from the compartment 404. The panels 408 and 410 prevent signal leakage between respective components within the compartments 400, 402, and 404. For example, the panel 408 prevents RF noise from leaking from the compartment 400 into the compartment 402, while the panel 410 prevents leakage between the compartments 402 and 404.

The compartment 400 may enclose the adjustable capacitor 332 and the encoder 340 and circuitry such as a printed circuit board (PCB) 412. The PCB 412 may correspond to a PCB comprising RF filter circuitry for filtering RF signals (e.g., as received via the RF cable connector 336) provided to the pedestal 112 (e.g., via the output contact interface 364). As shown, the adjustable capacitor 332 is mechanically coupled to the motor 344 via a shaft coupler 416 configured to rotate in accordance with the rotation of the motor 344 to adjust the adjustable capacitor 332. An insulative spacer 420 is arranged around the shaft coupler 416 between the adjustable capacitor 332 and a surface of the panel 406. Accordingly, the spacer 420 insulates the adjustable capacitor 332 from the panel 406.

The compartment 402 may enclose circuitry such as a high frequency filter PCB (not shown) including circuitry for filtering high frequency signals (e.g., from signals provided via the contact interface 378) and providing the filtered signals to the output contact interface 360. The compartment 404 may enclose circuitry such as a low frequency filter PCB 424 including circuitry for filtering low frequency signals (e.g., from signals provided via the contact interface 378) and providing the filtered signals to the output contact interface 360.

FIGS. 5A, 5B, 5C, and 5D show views of another example of the RF filter module 300 according to the present disclosure. In this example, the fans 348 and 352 are in an offset arrangement. Further, rather than providing the opening 384 such that the RF cable connector 336 passes through the leaf spring 382, the opening 384 is configured as a cutout around the RF cable connector 336 and the RF input connector 380. In contrast to the example described in FIGS. 3A and 3B, the RF input connector 380 is integrated with the RF cable connector 336. In other words, the RF cable connector 336 is not removably attached to the RF input connector 380 (e.g., using the nut 390). The top panel 320 and/or other panels of the RF filter module 300 may include one or more zip tie anchors 500 and a fan bracket 504.

Figure 5A:
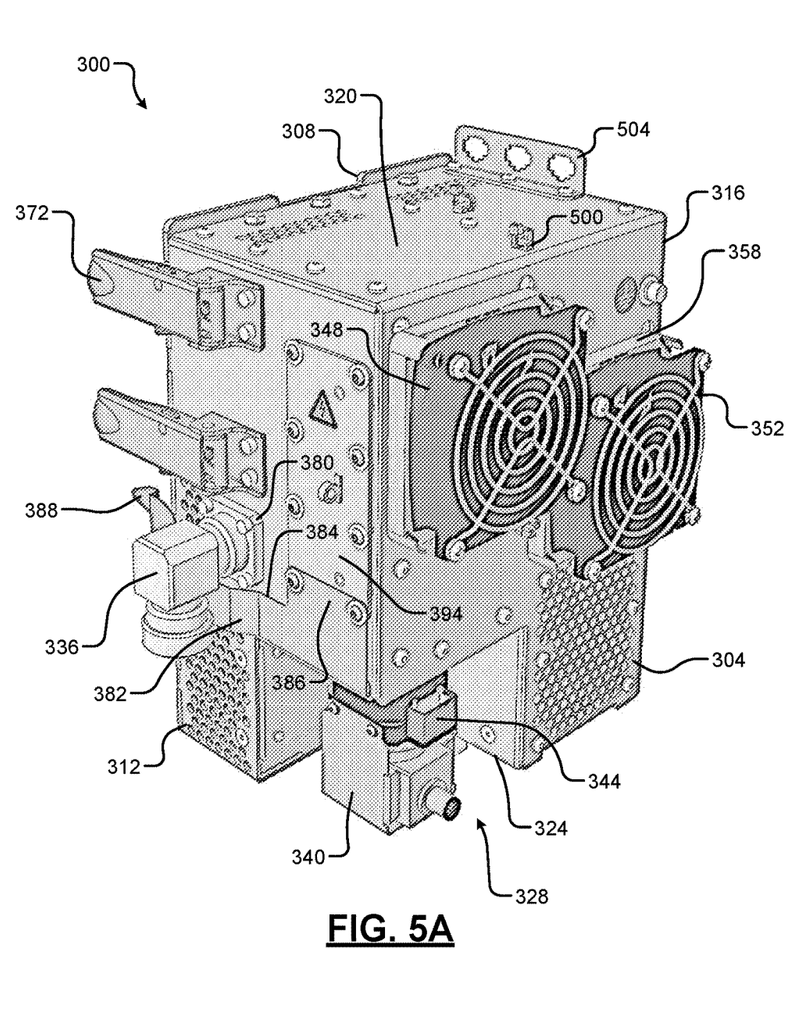
FIGS. 5A, 5B, 5C, and 5D are views of another example of the RF filter module according to the present disclosure.
Figure 5B:
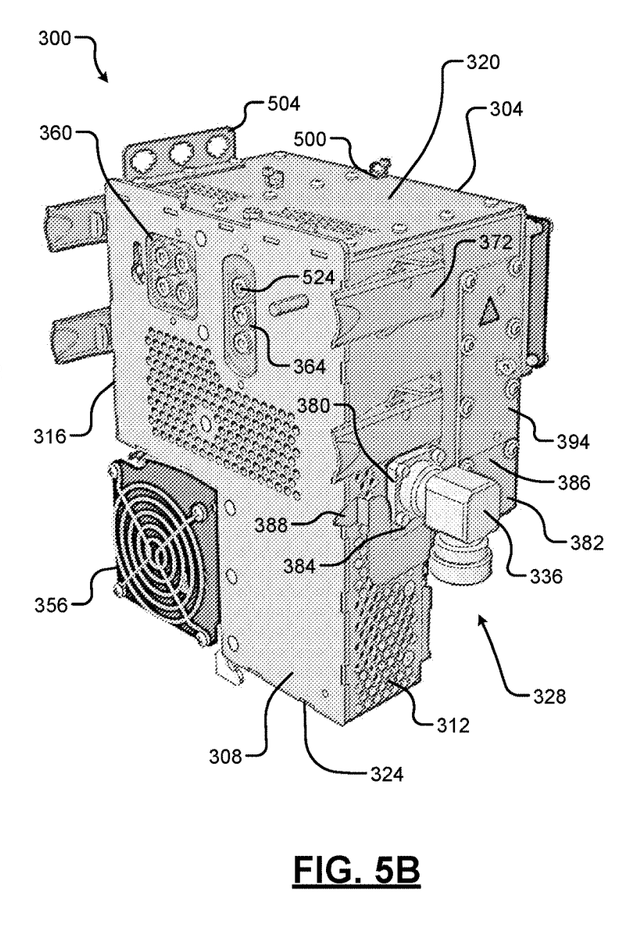
Figure 5C:
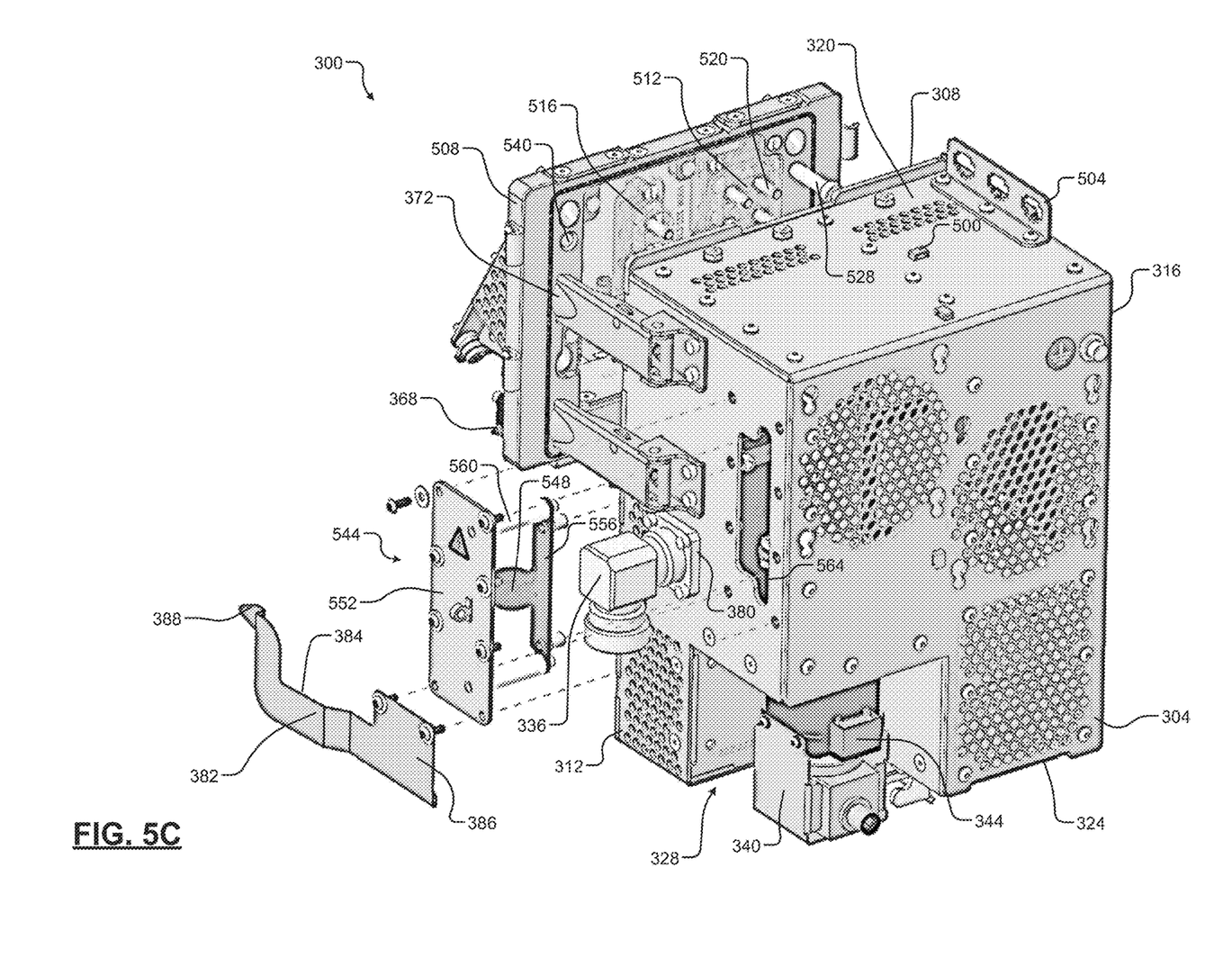
Figure 5D:
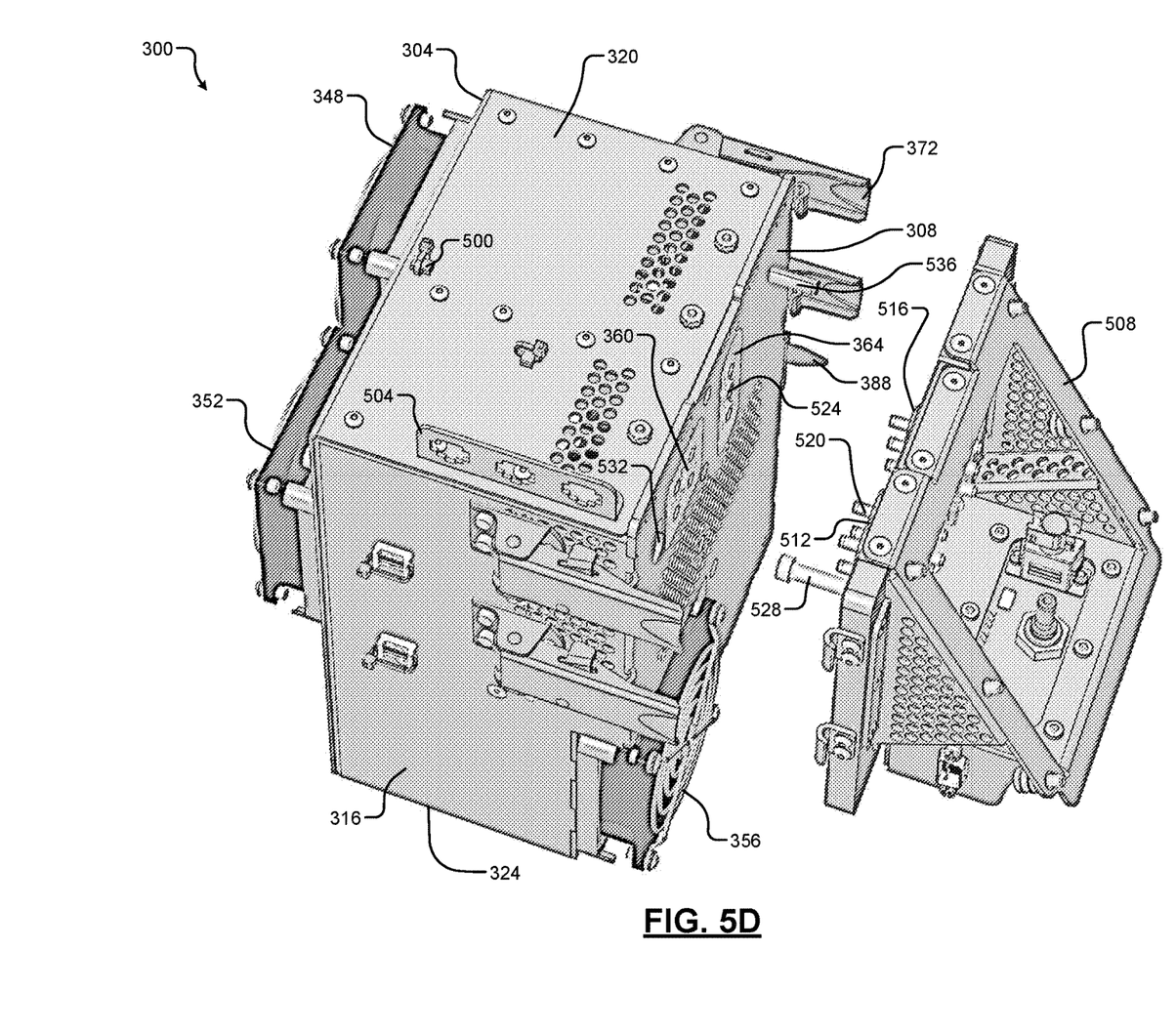

As shown in FIGS. 5C and 5D, the back panel 308 of the RF filter module 300 is configured to connect to an adapter bracket 508. For example, the adapter bracket 508 includes input contact interfaces 512 and 516 configured to connect to the output contact interfaces 360 and 364, respectively. For example, the input contact interfaces 512 and 516 include pins 520 configured to be inserted into respective sockets 524 of the output contact interfaces 360 and 364. Accordingly, when mounted on a processing chamber, the RF filter module 300 provides signals such as heater power and an RF output voltage to components of the processing chamber via the adapter bracket 508. An alignment pin 528 extending from the adapter bracket 508 is arranged to be inserted into an alignment hole 532 in the back panel 308 of the RF filter module 300. Conversely, an alignment pin 536 extending from the back panel 308 is arranged to be inserted into an alignment hole 540 in the adapter bracket 508. The contact switch 368 is arranged on the adapter bracket 508 as shown in FIG. 5C.

As shown in FIG. 5C, the mounting bracket 386 of the leaf spring 382 is connected to the side panel 312 and a tuning circuit assembly 544. The tuning circuit assembly 544 includes one or more components (e.g., an inductor 548) arranged on a mounting plate 552, which is attached to the side panel 312. For example, the inductor 548 is arranged on a printed circuit assembly 556 arranged between standoffs 560 extending from the mounting plate 552. The side panel 312 includes an opening 564 arranged to receive the components of the turning circuit assembly 544 extending from the mounting plate 552.

Figure 5E:
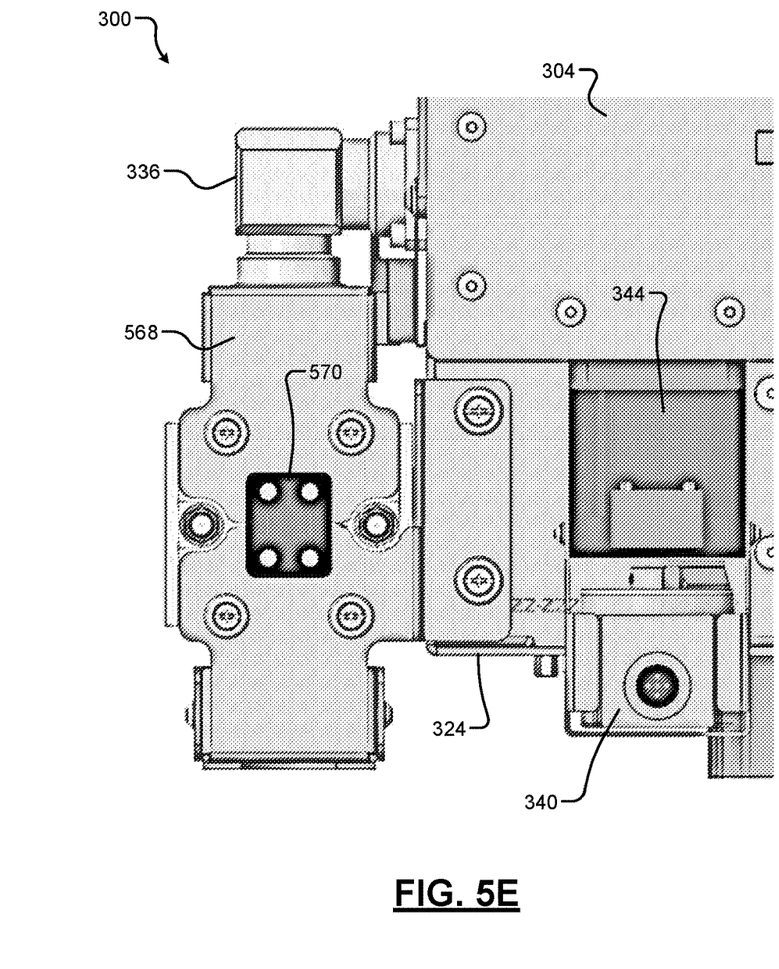
FIG. 5E is a view of a portion of the RF filter module according to the present disclosure.
Figure 5F:
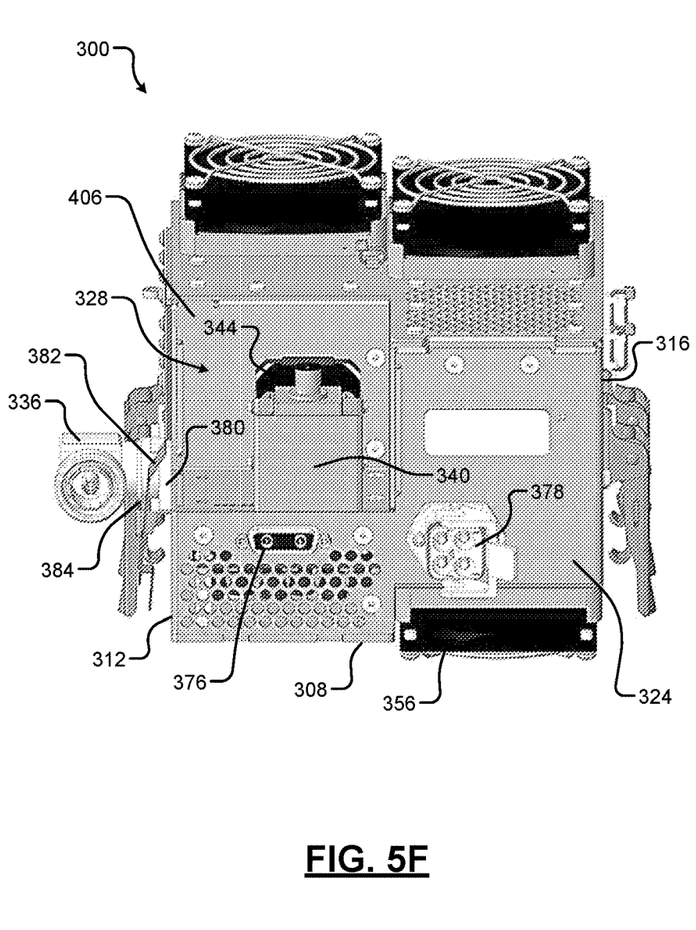
FIG. 5F is a bottom plan view of the RF filter module of FIGS. 5A, 5B, 5C, and 5D according to the present disclosure.

FIG. 5E shows a close-up view of a portion of a front panel 304 of the RF filter module 300 with a probe interface module 568 connected to the RF cable connector 336. The probe interface module 568 includes a connector 570 for connecting an RF probe (e.g., a VI probe). FIG. 5F is a bottom plan view of the RF filter module 300 of FIGS. 5A, 5B, 5C, and 5D.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A filter module for a substrate processing chamber, the filter module comprising:
   a plurality of exterior panels defining an interior;
   a plurality of internal panels defining a plurality of compartments within the interior of the filter module; and
   an adjustable capacitor arranged on a first panel of the plurality of internal panels within a first compartment of the plurality of compartments, wherein the adjustable capacitor is coupled, through the first panel, to a motor located outside of the first compartment, and wherein the adjustable capacitor is configured to receive a radio frequency input signal and provide a radio frequency voltage to the substrate processing chamber based on a position of the motor,
   wherein the motor is arranged within a notch on an exterior of the filter module.

2. The filter module of claim 1, wherein the adjustable capacitor is configured to provide the radio frequency voltage to filter circuitry within the first compartment and the filter circuitry is configured to provide a filtered RF frequency voltage to the substrate processing chamber.

3. The filter module of claim 1, further comprising an insulative spacer provided between the adjustable capacitor and the first panel.

4. The filter module of claim 1, further comprising an encoder configured to map a capacitance of the adjustable capacitor to the position of the motor, wherein the position of the motor is an absolute position of the motor.

5. The filter module of claim 1, wherein a second panel of the plurality of the internal panels separates the first compartment from a second compartment of the plurality of compartments.

6. The filter module of claim 5, wherein a third panel of the plurality of the internal panels separates the second compartment from a third compartment of the plurality of compartments.

7. The filter module of claim 6, wherein at least one of the second compartment and the third compartment includes filter circuitry configured to filter a heater power signal and provide the filtered heater power signal to the substrate processing chamber.

8. The filter module of claim 1, wherein the plurality of exterior panels includes a front panel, a back panel, a top panel, a bottom panel, and first and second side panels.

9. The filter module of claim 8, wherein the first side panel includes an input connector configured to receive a cable connector, wherein the input connector is configured to receive the radio frequency input signal via the cable connector.

10. A filter module for a substrate processing chamber, the filter module comprising:
   a plurality of exterior panels defining an interior;
   a plurality of internal panels defining a plurality of compartments within the interior of the filter module; and
   an adjustable capacitor arranged on a first panel of the plurality of internal panels within a first compartment of the plurality of compartments, wherein the adjustable capacitor is coupled, through the first panel, to a motor located outside of the first compartment, and wherein the adjustable capacitor is configured to receive a radio frequency input signal and provide a radio frequency voltage to the substrate processing chamber based on a position of the motor,
   wherein the plurality of exterior panels includes a front panel, a back panel, a top panel, a bottom panel, and first and second side panels,
   wherein the first side panel includes an input connector configured to receive a cable connector, wherein the input connector is configured to receive the radio frequency input signal via the cable connector, and
   wherein (i) a leaf spring is arranged on the first side panel between the input connector and the cable connector and (ii) the cable connector connects to the input connector through an opening in the leaf spring.

11. The filter module of claim 10, wherein a first end of the leaf spring is mounted on the first side panel and a second end of the leaf spring extends past a perimeter of the first side panel.

12. The filter module of claim 11, wherein the second end of the leaf spring extends over a contact switch arranged on the back panel of the filter module.

13. The filter module of claim 12, wherein connecting the cable connector to the input connector causes the second end of the leaf spring to engage the contact switch.

14. The filter module of claim 13, wherein the contact switch is configured to generate a signal indicating whether at least one of (i) the filter module is installed on the substrate processing chamber and (ii) the cable connector is connected to the input connector.

15. The filter module of claim 13, wherein the first side panel includes a removable access panel, and wherein the first end of the leaf spring is mounted to the first side panel through the removable access panel.

16. A substrate processing tool comprising a plurality of substrate processing chambers and a plurality of the filter modules of claim 1, wherein each of the plurality of filter modules is mounted on a respective one of the plurality of substrate processing chambers.

17. The substrate processing tool of claim 16, wherein each of the filter modules includes a removable side panel, and wherein the removable side panel of each of the filter modules faces an outer perimeter of the substrate processing tool.

18. A filter module for a substrate processing chamber, the filter module comprising:
   a plurality of exterior panels defining an interior;
   a plurality of internal panels defining a plurality of compartments within the interior of the filter module; and
   an adjustable capacitor arranged on a first panel of the plurality of internal panels within a first compartment of the plurality of compartments, wherein the adjustable capacitor is coupled, through the first panel, to a motor located outside of the first compartment, and wherein the adjustable capacitor is configured to receive a radio frequency input signal and provide a radio frequency voltage to the substrate processing chamber based on a position of the motor,
   wherein the adjustable capacitor is configured to provide the radio frequency voltage to filter circuitry within the first compartment and the filter circuitry is configured to provide a filtered RF frequency voltage to the substrate processing chamber, and
   wherein second and third compartments of the plurality of compartments each include respective circuitry,
   wherein the motor is arranged within a notch on an exterior of the filter module.

* * * * *